(12) United States Patent
Subramanian et al.

(10) Patent No.: US 7,008,832 B1
(45) Date of Patent: Mar. 7, 2006

(54) DAMASCENE PROCESS FOR A T-SHAPED GATE ELECTRODE

(75) Inventors: Ramkumar Subramanian, Sunnyvale, CA (US); Christopher F. Lyons, Fremont, CA (US); Marina V. Plat, San Jose, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/900,986

(22) Filed: Jul. 9, 2001

Related U.S. Application Data

(63) Continuation-in-part of application No. 09/620,300, filed on Jul. 20, 2000, now Pat. No. 6,417,084.

(51) Int. Cl.
*H01L 21/338* (2006.01)
(52) U.S. Cl. ........................... 438/182; 438/585
(58) Field of Classification Search .......... 438/182, 438/303, 197, 270, 585, 595
See application file for complete search history.

(56) References Cited

U.S. PATENT DOCUMENTS

| | | |
|---|---|---|
| 4,283,483 A | 8/1981 | Coane |
| 4,700,462 A | 10/1987 | Beaubien et al. |
| 4,795,718 A | 1/1989 | Beitman |
| 4,980,316 A | 12/1990 | Huebner |
| 4,997,778 A | 3/1991 | Sim et al. |
| 5,006,478 A | 4/1991 | Kobayashi et al. |
| 5,155,053 A | 10/1992 | Atkinson |
| 5,334,542 A | 8/1994 | Saito et al. |
| 5,496,779 A | 3/1996 | Lee et al. |
| 5,498,560 A | 3/1996 | Sharma et al. |
| 5,550,065 A | 8/1996 | Hashemi et al. |
| 5,559,049 A | 9/1996 | Cho |
| 5,563,079 A | 10/1996 | Shin et al. |
| 5,567,647 A | 10/1996 | Takahashi |
| 5,677,089 A | 10/1997 | Park et al. |
| 5,688,700 A | 11/1997 | Kao et al. |
| 5,688,704 A * | 11/1997 | Liu ............................ 438/303 |
| 5,766,967 A | 6/1998 | Lai et al. |
| 5,801,094 A | 9/1998 | Yew et al. |
| 5,858,824 A | 1/1999 | Saitoh |
| 5,891,783 A | 4/1999 | Lin et al. |
| 5,930,610 A | 7/1999 | Lee |
| 5,981,319 A | 11/1999 | Lothian et al. |
| 5,981,383 A * | 11/1999 | Lur et al. ................... 438/655 |

(Continued)

FOREIGN PATENT DOCUMENTS

JP 02-191348 7/1990

(Continued)

OTHER PUBLICATIONS

U.S. Appl. No. 09/620,300, "T-Gate Formation using a Modified Conventional Ply Process" filed on Jul. 20, 2000.

(Continued)

*Primary Examiner*—Jack Chen
(74) *Attorney, Agent, or Firm*—Foley & Lardner LLP

(57) ABSTRACT

A damascene process can be utilized to form a T-shaped gate. A silicon rich nitride or SiON layer can be etched to form a first aperture. An oxide layer can be provided above the silicon rich nitride layer or SiON layer. A second aperture or trench can be provided in the oxide layer. The second trench can have a larger width than the trench in the silicon rich nitride layer or SiON layer. A gate conductor material, such as polysilicon, can be provided in the first trench and/or the second trench.

19 Claims, 3 Drawing Sheets

U.S. PATENT DOCUMENTS

| | | | |
|---|---|---|---|
| 6,008,100 | A | 12/1999 | Yeh et al. |
| 6,033,952 | A | 3/2000 | Yasumura et al. |
| 6,077,733 | A | 6/2000 | Chen et al. |
| 6,077,761 | A | 6/2000 | Chen et al. |
| 6,121,113 | A | 9/2000 | Takatsuka et al. |
| 6,124,177 | A | 9/2000 | Lin et al. |
| 6,139,995 | A | 10/2000 | Burm et al. |
| 6,184,142 | B1 | 2/2001 | Chung et al. |
| 6,204,102 | B1 | 3/2001 | Yoon et al. |
| 6,235,626 | B1 | 5/2001 | Makino et al. |
| 6,255,202 | B1 | 7/2001 | Lyons et al. |
| 6,270,929 | B1 | 8/2001 | Lyons et al. |
| 6,306,710 | B1 | 10/2001 | Long et al. |
| 6,313,019 | B1 | 11/2001 | Subramanian et al. |
| 6,319,802 | B1 | 11/2001 | Subramanian et al. |
| 2001/0009784 | A1 | 7/2001 | Ma et al. |

FOREIGN PATENT DOCUMENTS

| | | |
|---|---|---|
| JP | 3268434 | 11/1991 |
| JP | 05-090220 | 4/1993 |
| JP | 07-111241 | 4/1995 |
| JP | 407321124 | 12/1995 |
| JP | 408195401 | 8/1996 |
| JP | 10-333341 | 12/1998 |
| JP | 2000-133636 | 5/2000 |

OTHER PUBLICATIONS

U.S. Appl. No. 09/620,145, "T-Gate Formation using Modified Damascene Processing with Two Masks" filed on Jul. 20, 2000.

U.S. Appl. No. 09/643,611, "T or T/Y Gate Formation Using Trim Etch Processing" filed on Aug. 22, 2000.

U.S. Appl. No. 09/619,789, "Damascene T-Gate using a RELACS Flow" filed on Jul. 20, 2000.

U.S. Appl. No. 09/619,836, "Damascene T-Gate using a Spacer Flow" filed on Jul. 20, 2000.

U.S. Appl. No. 09/643,343, "Y-Gate Formation using Damascence Processing" filed Aug. 22, 2000.

* cited by examiner

DAMASCENE PROCESS FOR A T-SHAPED GATE ELECTRODE

CROSS REFERENCE TO RELATED PATENT APPLICATIONS

The present application is a continuation-in-part of U.S. application Ser. No. 09/620,300, filed on Jul. 20, 2000 Now U.S. Pat. No. 6,417,084 entitled "T Gate Formation Using a Modified Conventional Poly Process" by Subramanian, et al.; U.S. application Ser. No. 09/643,343, filed on Aug. 22, 2000, entitled "Y Gate Formation Using Damascene Processing" by Subramanian, et al.; U.S. application Ser. No. 09/620,145, filed on Jul. 20, 2000 entitled "T Gate Formation Using Modified Damascene Processing with Two Masks", by Subramanian, et al.; U.S. application Ser. No. 09/643,611, filed on Aug. 22, 2000 entitled "T or T/Y Gate Formation Using Trim Etch Processing", by Subramaian, et al.; U.S. application Ser. No. 09/619,789, filed on Jul. 20, 2000 entitled "Damascene T-Gate Using a RELACS Flow", by Subramanian, et al; and U.S. application Ser. No. 09/619,836, filed on Jul. 20, 2000 entitled "Damascene T-Gate Using a Spacer Flow", by Subramanian, et al. All assigned to the Assignee of the present application.

FIELD OF THE INVENTION

The present invention relates generally to an integrated circuit (IC) and the fabrication of an integrated circuit. More particularly, the present invention relates to an integrated circuit having transistors with gate conductors having reduced resistance.

BACKGROUND OF THE INVENTION

Generally, it is desirous to manufacture smaller transistors to increase the component density on an integrated circuit. As transistors are reduced in size (CMOS scaling), the demands on lithographic tools have increased. Lithographic tools are utilized to form structures on the integrated circuit. For example, lithographic tools can be utilized to define gate conductors, conductive lines, vias, doped regions, and other structures associated with an integrated circuit.

In one type of conventional fabrication process, a photoresist is lithographically patterned by providing electromagnetic radiation such as ultraviolet light through an overlay. A conventional lithographic system is generally utilized to project the pattern to the photoresist material or layer. The photoresist material may be either a positive or a negative photoresist layer.

As the size of features on the integrated circuit reach sizes below 100 and even 50 nanometers, lithographic techniques are unable to precisely and accurately define the feature. For example, it is frequently desirous to reduce the width of the gate (the gate length) associated with a transistor. Future designs of transistors could require a gate conductor having a width of less than 50 nm.

In the case of a positive photoresist material or layer, the light causes photochemical reaction in the photoresist layer. The photoresist layer is removable with a developer solution at the portions of the photoresist that are exposed to light through a mask. The photoresist layer is developed to clear away those portions. An integrated circuit feature, such as a gate, via, or interconnect, is etched or doped into the layer of material, and the remaining photoresist is removed. In the case of a negative photoresist material, the light causes the photoresist layer to be removable with a developer solution at portions of the photoresist layer that are not exposed to light through the mask.

Various types of photoresist materials are manufactured by a number of manufacturers. The photoresist material can include multiple photoresist films (i.e. a multi-level resist (MLR)). According to some conventional processes, the photoresist layer is provided over an anti-reflective coating (ARC), such as silicon nitride ($Si_3N_4$) or silicon oxynitride (SiON). The anti-reflective coating is disposed above the material which is to be processed.

Conventional processes have utilized a variety of resolution enhancement technologies for lithographically creating patterns which define lines and spaces. These processes include the use of phase shift masks, resist enhancement lithography assisted by chemical shrink (RELACS), the use of reflow operations and the use of ultrathin photoresist layers.

RELACS techniques by Clariant AZ utilizes a polymer with an R2 coating and R200 developer to shrink the size of contact holes. The RELACS process can use a coat, diffusion bake and rinse step after wafer patterning.

T-shaped gate conductors have been considered for future designs. T-shaped gate conductors can reduce the resistance associated with small gate lengths due to the large gate width at the top transistor and yet achieve densely packed transistors due to the small gate width at the bottom. Heretofore, T-shaped gate conductors have not been formed according to resolution enhancement.

Thus, there is a need for a method of making a novel transistor structure which is less susceptible to gate resistance and yet has an acceptable size. Further still, there is a need for a dual damascene method for manufacturing a gate structure. Even, further still, there is a need for a method of fabricating a gate structure which provides a gate conductor having a width less than a width achievable by conventional lithographic techniques.

SUMMARY OF THE INVENTION

An exemplary embodiment relates to a method of manufacturing an integrated circuit. The method includes providing a gate dielectric above a top surface of a substrate, providing a silicon and nitrogen containing layer above the gate dielectric layer, and providing an oxide layer above the silicon and nitrogen containing layer. The method also includes steps of selectively etching the oxide layer to form a first trench in the oxide layer, selectively etching the silicon and nitrogen containing layer to form a second trench in the silicon and nitrogen containing layer, and providing a gate conductor material in the first trench and second trench. The second trench is narrower than the first trench and disposed below the first trench.

Still another exemplary embodiment relates to a method of manufacturing an ultra-large scale integrated circuit. The integrated circuit includes a transistor with a T-shaped conductor. The method includes steps of providing a first layer above a substrate, providing an oxide layer on the first layer, forming a first trench in the oxide layer, forming a second trench in the first layer, and providing a gate conductor material in the first trench and the second trench to form the T-shaped conductor. The first layer is a silicon rich nitride layer or a silicon oxynitride layer. The second trench has a smaller width than the first trench.

Still another exemplary embodiment relates to a method of manufacturing a gate conductor for an integrated circuit. The method includes providing a first layer above a gate dielectric layer, forming an aperture in the first layer utilizing a RELACS process, filling the aperture with a gate conductor material, and removing the gate conductor material above the first layer. The gate dielectric layer is disposed above the a substrate, and the first layer includes silicon oxynitride or silicon rich nitride.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
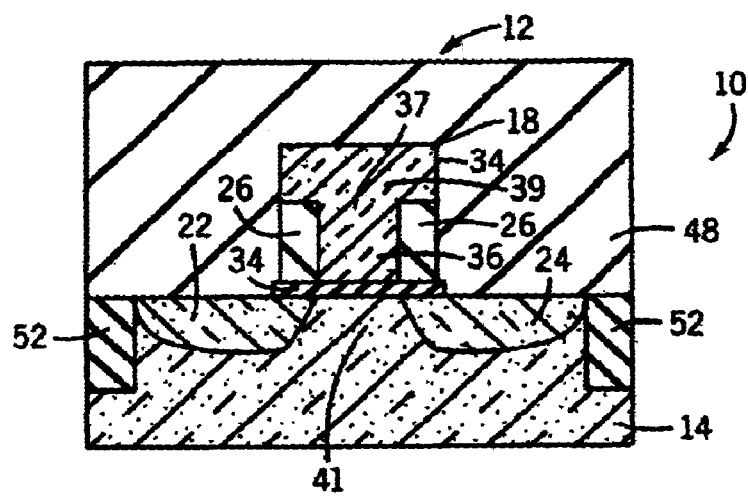
FIG. 1 is a cross-sectional view of a portion of an integrated circuit including a transistor with a T-shaped gate electrode in accordance with an exemplary embodiment.

With reference to FIG. 1, a portion 10 of an integrated circuit (IC) includes a transistor 12 which is disposed on a semiconductor substrate 14, such as, a wafer. Semiconductor substrate 14 is preferably a bulk P-type silicon substrate including isolation structures 52. Alternatively, substrate 14 can be any type of IC substrate including a gallium arsenide (GaAs), germanium, or a semiconductor-on-insulator (SOI) substrate (e.g., a silicon-on-glass substrate).

Transistor 12 can be a P-channel or N-channel metal oxide semiconductor field effect transistor (MOSFET). Transistor 12 includes a gate structure 18, a source region 22, and a drain region 24. For an N-channel transistor, regions 22 and 24 are heavily doped with N-type dopants (e.g., $5 \times 10^{19}$–$1 \times 10^{20}$ dopants per cubic centimeter). For a P-channel transistor, regions 22 and 24 are heavily doped with P-type dopants ($5 \times 10^{19}$–$1 \times 10^{20}$ dopants per cubic centimeter). An appropriate dopant for a P-channel transistor is boron, boron diflouride, or iridium, and an appropriate dopant for an N-type transistor is arsenic, phosphorous, or antimony.

Source and drain regions 22 and 24 can be provided with extensions. Preferably, ultra-shallow extensions (e.g., junction depth is less than 250 Å), preferably 10–25 nanometers (nm)) are integral with regions 22 and 24. The source and drain extensions can be disposed partially underneath gate structure 18.

A channel region 41 underneath gate structure 18 separates regions 22 and 24. Region 41 can be doped according to device parameters. For example, region 41 can be doped according to a super steep retrograded well region.

Gate stack or structure 18 includes a T-shaped conductor 37, and a gate dielectric layer 34. T-shaped conductor 37 has a top portion 39 and a bottom portion 36. The width of channel region 41 (the gate length) is approximately the width of bottom portion 36 of gate conductor 37.

Bottom portion 36 has a smaller width than top portion 39. Preferably, the width of the bottom portion 36 is 250–1500 Å and the width of top portion 39 is 400–2000 Å. Bottom portion 36 is preferably 1000–2000 Å in height and top portion 39 is preferably 500–1000 Å in height. Gate structure 18 has a total height of 1000–3000 Å.

Top portion 39 of T-shaped gate conductor 37 and regions 22 and 24 can be silicided. Contacts and interconnects can be electrically coupled to top portion 39 and regions 22 and 24.

Dielectric layer 34 is preferably a 15 to 30 nm thick thermally grown silicon dioxide layer. Alternatively, layer 34 can be a silicon nitride ($Si_3N_4$) layer. Dielectric layer 34 can be comprised of a high-k dielectric material such as a 2–10 nm thick layer of tantalum pentaoxide ($Ta_2O_5$), aluminum oxide ($Al_2O_3$), titanium dioxide ($TiO_2$) or other material having a dielectric constant (k) over 8.

T-shaped gate conductor 37 is preferably a semiconductive material. According to one embodiment, conductor 37 can be a polysilicon, germanium, or a silicon/germanium material. T-shaped gate conductor 37 is also preferably heavily doped with an N-type dopant, such as phosphorous (P), arsenic (As) or other dopant. Alternatively, gate conductor 37 can be doped with a P-type dopant, such a boron (B), boron diflouride ($BF_2$), or other dopants.

T-shaped gate conductor 37 can be implanted with dopants or with other semiconductive materials or can be an in situ doped material. According to another embodiment, T-shaped conductor 37 can be a metal material.

Spacers 26 can abut lateral sides of bottom portion 36 of gate conductor 37. Spacers 26 can be located between portion 39 and gate dielectric layer 34. In addition, spacers 26 can be located below a bottom surface of top portion 39 of gate conductor 37. Preferably, spacers 26 are 1000–2000 Å high.

Spacers 26 are preferably a silicon oxynitride (SiON) material or a silicon rich nitride material (SiRN). Alternatively, spacers 26 can be other insulative materials like $SiO_2$ or SiN. Preferably, spacers 26 are formed in accordance with the process described below with reference to FIGS. 1–9.

Transistor 12 can be an N-channel or a P-channel field effect transistor, such as, a metal oxide semiconductor field effect transistor (MOSFET). Transistor 12 is at least partially covered by insulative layer 48 and is preferably part of an ultra-large scale integrated (ULSI) circuit that includes one million or more transistors.

With reference to FIGS. 1–9, an advantageous process of forming transistor 12 is described below. The process advantageously provides a novel damascene fabrication flow in which a T-shaped gate conductor is formed. Preferably, a RELACS process is utilized to form bottom portion of 36 of gate conductor 37.

Figure 2:
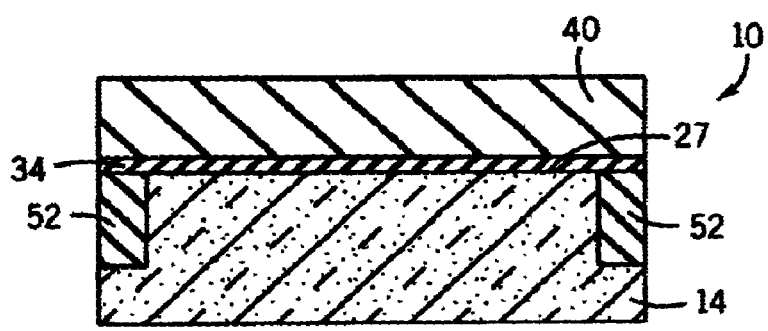
FIG. 2 is a cross-sectional view of the portion of the integrated circuit illustrated in FIG. 1, showing a gate dielectric deposition step and a silicon rich nitride or silicon oxynitride deposition step.

With reference to FIG. 2, substrate 14 includes top surface 27 having gate dielectric layer 34 disposed thereon. Preferably, gate dielectric layer 34 is a silicon dioxide ($SiO_2$) layer formed by chemical vapor deposition (CVD) or thermal growth. Alternatively, layer 34 can be other materials including silicon nitride or high-K dielectric materials.

Substrate 14 can include isolation regions 52 and source and drain regions 22 and 24 (FIG. 1) before layer 34 is provided. The formation of regions 22 and 24 and other transistor structures unrelated to gate structure 18 is beyond the scope of this disclosure.

After layer 34 is deposited, a layer 40 is deposited above layer 34. Layer 40 is preferably a silicon and nitrogen containing layer. In one embodiment, layer 40 can be a silicon oxynitride (SiON) layer. In an alternative embodiment, layer 40 can be a silicon rich nitride layer (SiRN). Layer 40 is preferably 2000 Å thick and deposited by chemical vapor deposition (CVD).

Figure 3:
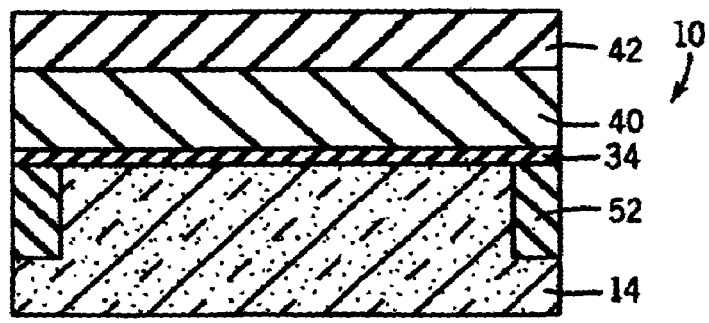
FIG. 3 is a cross-sectional view of the portion of the integrated circuit illustrated in FIG. 2, showing an oxide layer deposition step.

With reference to FIG. 3, an oxide layer 42 is provided above layer 40. Layer 42 can be deposited by chemical vapor deposition (CVD). Preferably, layer 42 has a thickness of 500 and includes silicon dioxide ($SiO_2$). Alternatively, layer 42 can be grown above layer 40. Layer 40 preferably has different etch characteristics than layer 42.

Figure 4:
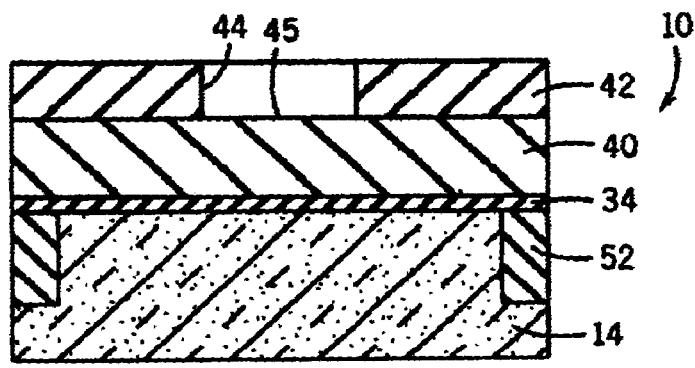
FIG. 4 is a schematic cross-sectional view of the portion illustrated in FIG. 3, showing a selective etching step.

With reference to FIG. 4, layer 42 is selectively etched or removed to provide a first trench 44 in layer 42. Preferably, trench 44 has a width of 500 Å associated with the width of top portion 39 of gate conductor 37 (FIG. 1). Trench 44 exposes a top surface 45 of layer 40.

Layer 42 is preferably patterned to form trench 44 in accordance with a dark field mask. A conventional photolithographic process via the dark field mask can pattern a photoresist layer above layer 42. An etching step selective to silicon oxide with respect to silicon oxynitride or silicon rich nitride can be used to form aperture or trench 44. After etching, the pattern photoresist mask can be removed from above layer 42.

Figure 5:
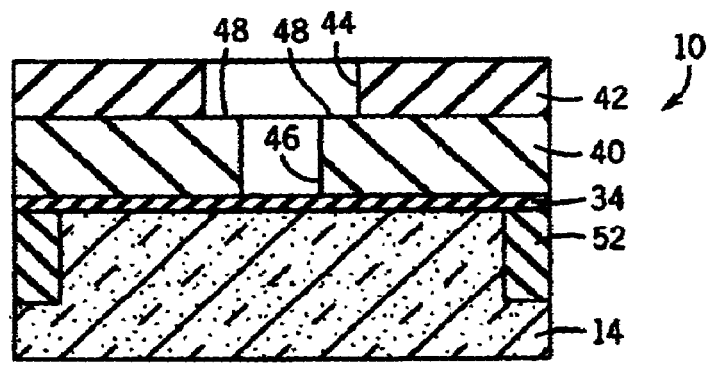
FIG. 5 is a cross-sectional view of the portion of the integrated circuit illustrated in FIG. 4, showing an etching step.

With reference to FIG. 5, layer 40 is selectively removed or etched to form a trench 46. Trench 46 preferably has a width smaller than the width of trench 44. In one embodiment, the width of trench 46 is 350 Å or 70 percent of the width of trench 44. Trench 46 can be formed in a conventional photolithographic process similar to the process used to form trench 44 or in a RELACS process as described with reference to FIG. 9. Trench 46 extends to dielectric layer 34.

According to the conventional photolithographic process, layer 42 and exposed surfaces 48 of trench 44 are covered with a photoresist layer. The photoresist layer is selectively patterned. Layer 40 is etched in accordance with the patterned photoresist material to form trench 46. Layer 40 can be etched using a process selective to silicon oxynitride or silicon rich nitride with respect to silicon dioxide. Preferably, a dry etching process is utilized.

Figure 6:
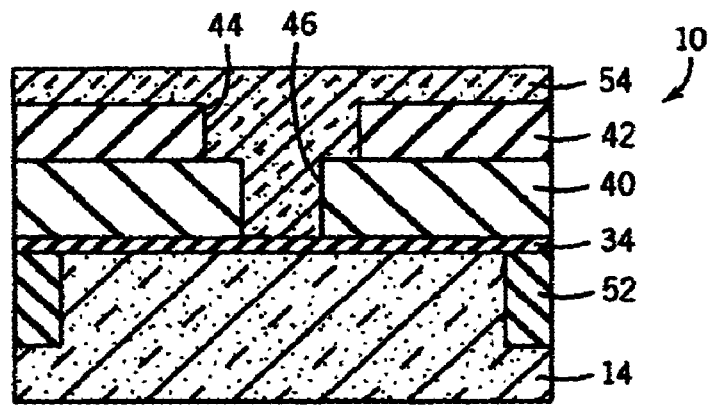
FIG. 6 is a schematic cross-sectional view of the portion of the integrated circuit illustrated in FIG. 5, showing a gate conductor deposition step.

With reference to FIG. 6, after trenches 44 and 46 are formed, a gate conductor material 54 is provided in trenches 44 and 46. Preferably, gate conductor material 54 is deposited as a conformal layer. A 3000–5000 Å thick layer of polysilicon (doped or undoped) can be deposited by CVD and polished back to final thickness. In another embodiment, a refractory metal or other gate conductor material can be utilized as material 54.

Figure 7:
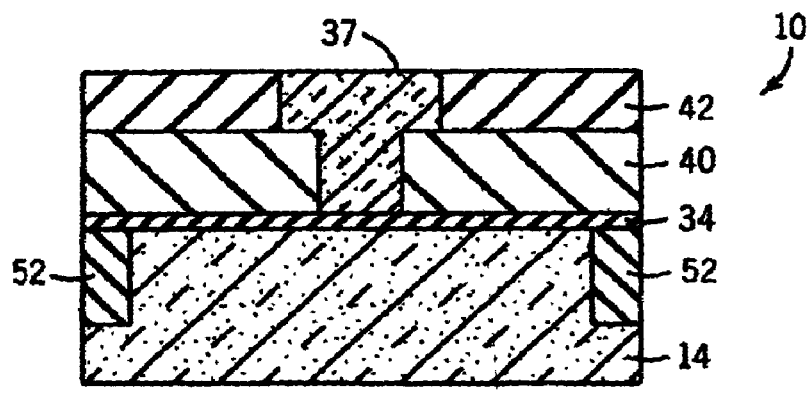
FIG. 7 is a schematic cross-sectional view of the integrated circuit illustrated in FIG. 6, showing a polishing step.

With reference to FIG. 7, material 54 is polished to leave gate conductor 37 in trenches 44 and 46 (FIG. 6). Alternatively, other removal processes can be utilized including etching techniques.

Figure 8:
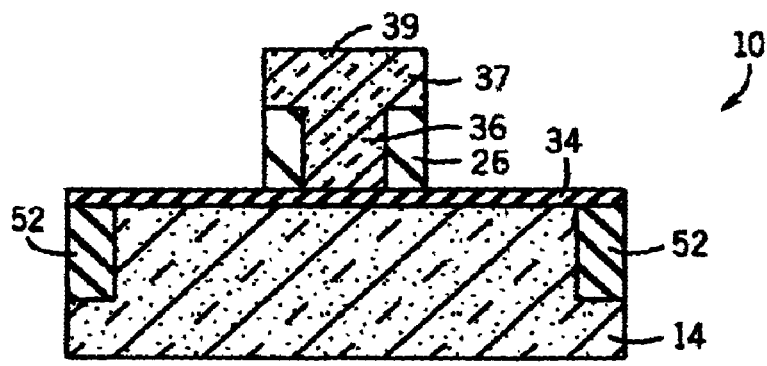
FIG. 8 is a schematic cross-sectional view of the integrated circuit illustrated in FIG. 7, showing an oxide layer removal step and a spacer formation step.

With reference to FIG. 8, layer 42 can be removed in a dry etching process. After layer 42 is removed, layer 40 can be removed. In one embodiment, layer 40 can be completely removed by dry etching. Portions of layer 34 can also be removed by wet or dry etching.

According to another embodiment, layer 42 can be selectively removed using top portion 39 of gate conductor 37 (material 54 within trench 44) as an etch mask to leave spacers 26 between conductor 36 and substrate 14. In this embodiment, spacers 26 include silicon oxynitride or silicon rich nitride (the material of layer 40 FIGS. 2–7).

With reference to FIG. 1, source and drain regions 22 and 24 can be formed if they have not already been formed. In accordance with conventional processes, further conventional processes can be utilized to provide insulative layer 48, contacts, vias and other interconnects.

Figure 9:
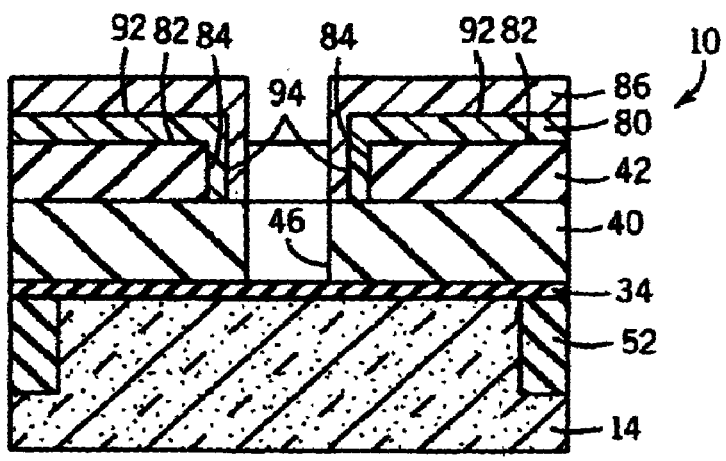
FIG. 9 is a schematic cross-sectional view of the integrated circuit illustrated in FIG. 5, showing a RELACS processing step in accordance with another exemplary embodiment.

With reference to FIG. 9, a resist enhancement lithography assisted by chemical shrink (RELACS) process can be utilized to form aperture or trench 46. The RELACS process is begun after trench 44 is formed as described with reference to FIG. 4.

In FIG. 9, after trench 44 (not shown in FIG. 9) is formed, a photoresist layer 80 is provided above layer 42. Layer 80 can be spun on to layer 42 as a 2000–6000 Å thick layer. Layer 80 can be a photoresist material such as Shipley's UV210 for use at 248 nm lithography or Sumitomo's PAR707 for use at 193 nm or other suitable resists. Photoresist layer 80 is preferably provided on a top surface 82 of layer 42 and sidewalls 84 of layer 42. Layer 80 is patterned to have an aperture with a width smaller than trench 44 and larger than trench 46.

After layer 80 is provided, a RELACS polymer 86 is provided over layer 80. Preferably, after layer 80 is patterned, RELACS polymer 86 is spread onto and around resulting in the formation as shown in FIG. 9. The preferred method for spreading RELACS polymer 86 onto layer 80 is by spin coating. Other methods of spreading RELACS polymer 86 are contemplated. For example, a spray coat process may apply polymer 86.

Polymer 86 covers patterned photoresist layer 80 and bonds with layer 80. Bonding takes place on a top surface 92 of layer 80 and sidewalls 94 of layer 80. Bonding can be due to cross linking of polymer 86 with surface 92 and sidewalls 94. Polymer 86 can be a 10–70% of the resist thickness.

Polymer 86 is removed in a blanket etch process from surface 92 of photoresist layer 80. Preferably, the blanket etch is an anisotropic etch. The anisotropic etch removes portions of polymer 86 from top surface 92 and sidewalls 94. However, portions of polymer 86 remain disposed against sidewalls 94 of layer 80.

According to another embodiment, layer 86 can be removed in a chemical mechanical polishing (CMP) process. The CMP process removes polymer 86 from surface 92 and sidewalls 94 and allows polymer 86 to remain on sidewalls 94.

According to both embodiments, polymer 86 is left on sidewalls 84 and defines trench 46. The size of trench 46 can be controlled by the controlling the time in which polymer 86 is spread over patterned layer 80 (a longer spreading time results in wider RELACS polymer sidewall portions). Further, the removal chemistry and time can be varied to adjust the size defined by portions of polymer 86 on sidewalls 94.

Layer 40 is etched in accordance with the portions on sidewalls 94 to provide trench 46. Preferably, layer 40 is etched in a dry etching process. After etching trench 46, polymer 86, layers 82 and 80 can be completely stripped from portion 10.

According to another embodiment, conductor 36 is not T-shaped but instead has a rectangular cross section. According to such an embodiment, the method utilized to form transistor 12 discussed with reference to FIGS. 1–8 is utilized. However, steps related to the use of oxide in trench 44 are removed. Instead, trench 46 is formed using a RELACS process and gate conductor material 54 is deposited only in trench 46 to form a gate conductor 37 including only bottom portion 36. According to this process, a small cross-sectional gate for gate conductor 37 is achieved (e.g., smaller than available according to conventional lithographic techniques).

It is understood that while preferred embodiments and specific examples are given, they are for the purpose of illustration only and are not limited to the precise details disclosed. For example, although specific RELACS processes are discussed, other etching techniques can be utilized. Various modifications may be made in the details within the scope and range of equivalents of the claims without departing from what is claimed.

What is claimed is:

1. A method of manufacturing an integrated circuit having a T-shaped gate conductor, the method comprising the following steps performed in the order below:
    providing a gate dielectric layer above a top surface of a substrate;
    providing a silicon and nitrogen containing layer above the gate dielectric layer;
    providing an oxide layer above the silicon and nitrogen containing layer;
    selectively etching the oxide layer to form a first trench in the oxide layer;
    selectively etching the silicon and nitrogen containing layer to form a second trench in the silicon and nitrogen containing layer, the second trench being narrower than the first trench and being disposed below the first trench; and
    providing a gate conductor material in the first trench and the second trench to form the T-shaped gate conductor.

2. The method of claim 1, further comprising removing the oxide layer.

3. The method of claim 2, further comprising:
    removing portions of the silicon and nitrogen containing layer, whereby a pair of spacers remain underneath the gate conductor material in the first trench.

4. The method of claim 3, wherein the gate conductor material is removed by a polishing process.

5. The method of claim 1, wherein a width of the first trench is at least 250 Å and less than 1600 Å.

6. The method of claim 5, wherein the width of the second trench is at least 400 Å and less than 2100 Å.

7. The method of claim 1, wherein the gate dielectric layer is silicon dioxide.

8. A method of manufacturing a T-shaped gate conductor for an integrated circuit, the method comprising:
    providing a first layer above a gate dielectric layer, the gate dielectric layer being above a substrate, the first layer including silicon and nitrogen;
    providing a second layer above the first layer;
    selectively etching a first aperture in the second layer by etching;
    selectively etching a second aperture in the first layer utilizing an etching process, wherein the second aperture is narrower than the first aperture;
    filling the first aperture and the second aperture with a gate conductor material; and
    removing the gate conductor material above the second layer, thereby leaving the T-shaped gate conductor in the first and second aperture, wherein the gate dielectric is provided before the first layer is provided.

9. The method of claim 8, wherein:
    the second layer is an oxide layer.

10. The method of claim 9, wherein the gate conductor material is doped or undoped polysilicon material.

11. The method of claim 9, wherein the gate conductor material is silicided.

12. The method of claim 9, wherein the oxide layer is silicon dioxide.

13. The method of claim 8, wherein the gate dielectric layer is silicon dioxide.

14. A method of manufacturing an ultra-large scale integrated circuit including a transistor with a T-shaped gate conductor, the method includes steps of:
    providing a gate dielectric layer above a substrate;
    after providing the gate dielectric layer, providing a first layer above the gate dielectric layer, the first layer including a silicon and nitrogen;
    providing an oxide layer over the first layer;
    selectively etching a first trench in the oxide layer;
    selectively etching a second trench in the first layer, the second trench having a smaller width than the first trench; and
    providing a gate conductor material in the first trench and in the second trench to form the T-shaped gate conductor.

15. The method of claim 14, further comprising removing the oxide layer.

16. The method of claim 14, further comprising removing portions of the first layer to leave spacers underneath the gate conductor material in the first trench, the removal process utilizing the gate conductor material as a mask.

17. The method of claim 14, wherein the gate dielectric layer is silicon dioxide.

18. The method of claim 14, wherein the gate conductor material is doped polysilicon.

19. The method of claim 14, wherein the first trench is between 1600 Å and 250 Å wide.

* * * * *